United States Patent
Wu

(10) Patent No.: US 9,801,296 B1
(45) Date of Patent: Oct. 24, 2017

(54) HOUSING DEVICE HAVING PULL-TYPE LOCKING AND RELEASE STRUCTURE

(71) Applicants: DINKLE ENTERPRISE CO., LTD., New Taipei (TW); DINKLE ELECTRIC MACHINERY (CHINA) CO., LTD., Kunshan, Jiangsu (CN)

(72) Inventor: Shang-Tsai Wu, New Taipei (TW)

(73) Assignees: DINKLE ENTERPRISE CO., LTD., New Taipei (TW); DINKLE ELECTRIC MACHINERY (CHINA) CO., LTD., Kunshan, Jiangsu (CN)

( * ) Notice: Subject to any disclaimer, the term of this patent is extended or adjusted under 35 U.S.C. 154(b) by 0 days.

(21) Appl. No.: 15/406,946

(22) Filed: Jan. 16, 2017

(51) Int. Cl.
| | |
|---|---|
| H05K 7/16 | (2006.01) |
| H05K 5/00 | (2006.01) |
| H05K 5/02 | (2006.01) |
| E05C 9/00 | (2006.01) |
| E05C 3/16 | (2006.01) |
| E05B 65/00 | (2006.01) |
| H05K 5/03 | (2006.01) |
| H05K 7/14 | (2006.01) |

(52) U.S. Cl.
CPC ........... *H05K 5/0221* (2013.01); *E05B 65/00* (2013.01); *E05C 3/16* (2013.01); *E05C 9/00* (2013.01); *H05K 5/0013* (2013.01); *H05K 5/0026* (2013.01); *H05K 5/023* (2013.01); *H05K 5/03* (2013.01); *H05K 7/1427* (2013.01)

(58) Field of Classification Search
CPC ...... H05K 5/0221; H05K 5/0013; H05K 5/03; H05K 5/023; H05K 7/1427; H05K 5/0026; E05C 9/00; E05C 3/16; E05B 65/00

USPC ................... 174/50; 361/725, 726
See application file for complete search history.

(56) References Cited

U.S. PATENT DOCUMENTS

| | | | | |
|---|---|---|---|---|
| 4,829,595 A | * | 5/1989 | Kobayashi | .......... B60R 11/0205 312/7.1 |
| 5,020,151 A | * | 5/1991 | Sampei | ............... B60R 11/0205 312/7.1 |

(Continued)

FOREIGN PATENT DOCUMENTS

| | | |
|---|---|---|
| DE | 7819431 U1 | 10/1978 |
| GB | 2211241 A | 6/1989 |

OTHER PUBLICATIONS

Search Report dated Jul. 7, 2017 of the corresponding European patent application.

*Primary Examiner* — Sherman Ng
(74) *Attorney, Agent, or Firm* — Chun-Ming Shih; HDLS IPR Services

(57) ABSTRACT

A housing device having a pull-type locking and release structure includes a housing (110) and a locking and release member (150). The housing (110) includes two lateral walls (130), a breach (132) formed on each of the lateral walls (130), and an elongated groove (134) formed along each of the lateral walls (130), a pivot hole (136) formed on each of the lateral walls (130). The locking and release member (150) includes two arms (152) disposed in the two elongated grooves (134), a rod (156) connected to the two arms (152), a resilient element (160) disposed at each of the arms (152), a connection element (170) connected to each of the arms (152), a fastening element (180) connected to each of the connection elements (170), and a pivot (182) protruding from each of the fastening elements (180). The pivot (182) is pivotally connected to the pivot hole (136).

18 Claims, 13 Drawing Sheets

(56) References Cited

U.S. PATENT DOCUMENTS

| | | | |
|---|---|---|---|
| 5,152,496 A | | 10/1992 | Kobayashi |
| 5,169,097 A | * | 12/1992 | Yasukawa ............... B60K 37/04 248/27.1 |
| 5,216,904 A | * | 6/1993 | Isaki ....................... B60K 37/04 16/445 |
| 5,953,302 A | * | 9/1999 | Kobayashi ............ G11B 33/027 361/814 |
| 6,231,144 B1 | * | 5/2001 | Chen .................... H05K 7/1411 312/223.2 |
| 8,496,210 B2 | * | 7/2013 | Chang ..................... G06F 1/181 248/221.11 |
| 8,498,120 B2 | * | 7/2013 | Chen .................... H05K 5/0221 312/223.1 |
| 2008/0158810 A1 | * | 7/2008 | Liu ....................... G11B 33/124 361/679.33 |

* cited by examiner

HOUSING DEVICE HAVING PULL-TYPE LOCKING AND RELEASE STRUCTURE

TECHNICAL FIELD

The present invention relates to a housing device and, in particular, to a housing device having a pull-type locking and release structure, whereby a housing can be released quickly and easily with only one hand.

BACKGROUND

Electronic devices, like a router, a set-top box, a wireless module, a control module, and a digital input/output device, have different circuit boards inside their housings according to different needs.

Furthermore, the housings of electronic devices normally have one or multiple connection ports like a network port, a video cable port, an audio cable port, and a power port. These connection ports are provided for insertion of related cables/lines. The housings of the electronic devices typically have a rectangular shape. When there is a need to replace or repair components inside the electronic devices, a user has to detach the housing with both hands, which is time-consuming, labor-intensive, and very inconvenient.

Accordingly, the target of the inventor is to solve the above-mentioned problems, on the basis of which the present invention is accomplished.

SUMMARY

It is an object of the present invention to provide a housing device having a pull-type locking and release structure, whereby a housing can be released quickly and easily with only one hand.

Accordingly, the present invention provides a housing device having a pull-type locking and release structure. The housing device includes a housing and a locking and release member. The housing includes two lateral walls, a breach formed on each of the lateral walls, an elongated groove formed along each of the lateral walls, and a pivot hole formed on each of the lateral walls, wherein each of the pivot holes communicates with a corresponding one of the elongated grooves. The locking and release member includes two arms disposed in the two elongated grooves, a rod connected to the two arms, a resilient element disposed at one end of each of the arms, a connection element connected to each of the arms, a fastening element connected to each of the connection elements, and a pivot protruding from one side of each of the fastening elements. The pivot is pivotally connected to the pivot hole, and the fastening element is rotatable about the pivot. When the rod drives the two arms to move with respect to the elongated grooves, the connection element pushes one end of the fastening element to move, and the other end of the fastening element is away from the breach.

The present invention collaborates with a casing having two fastening holes. The two fastening holes are disposed corresponding to the two breaches. The two fastening elements of the locking and release member are engaged with the two fastening holes, respectively, for assembling the housing to the casing. By means of the lever principle, the pivots of the two fastening elements are fixed in the pivot holes of the housing, a single rod drives movement of the two arms, and the arm drives one end of the fastening element, so that the other end of the fastening element is away from the breach to be disengaged and released from the fastening hole of the casing. Accordingly, the housing device and the casing can be quickly detached or assembled, thereby facilitating maintenance or repairing electronic components inside.

The present invention utilizes the installed or integrally-formed resilient element. Therefore, when a strain pulling the locking and release member is released, the elasticity of the resilient element automatically pushes the corresponding arm and the corresponding connection element. The connection element pushes the corresponding fastening element, so that the fastening elements return to the respective breaches. Accordingly, a user can quickly engage the housing device with the two fastening holes of the casing, in a convenient and time-saving manner.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Figure 1:
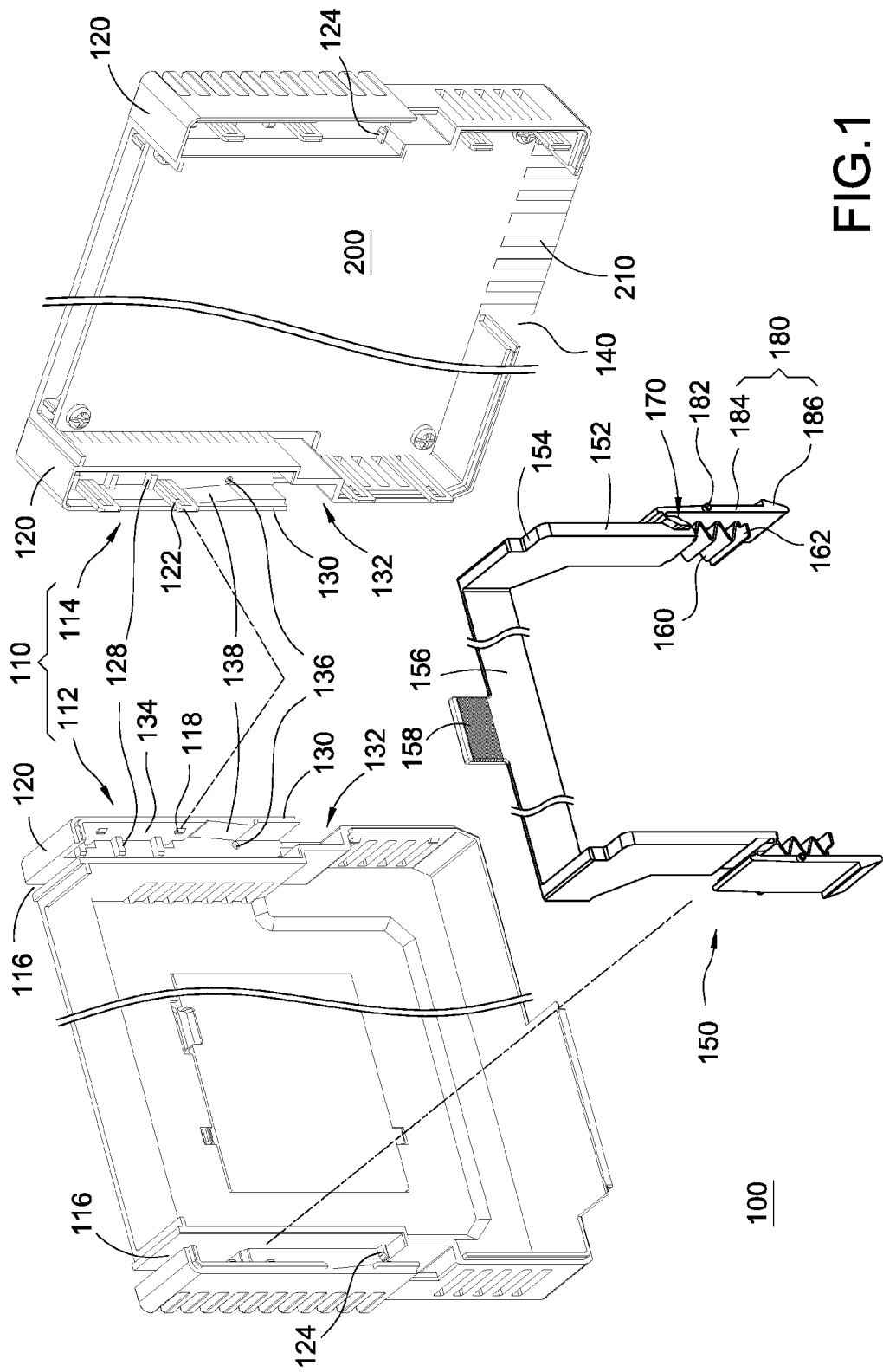
FIG. 1 is an exploded view according to the first embodiment of the present invention.
Figure 2:
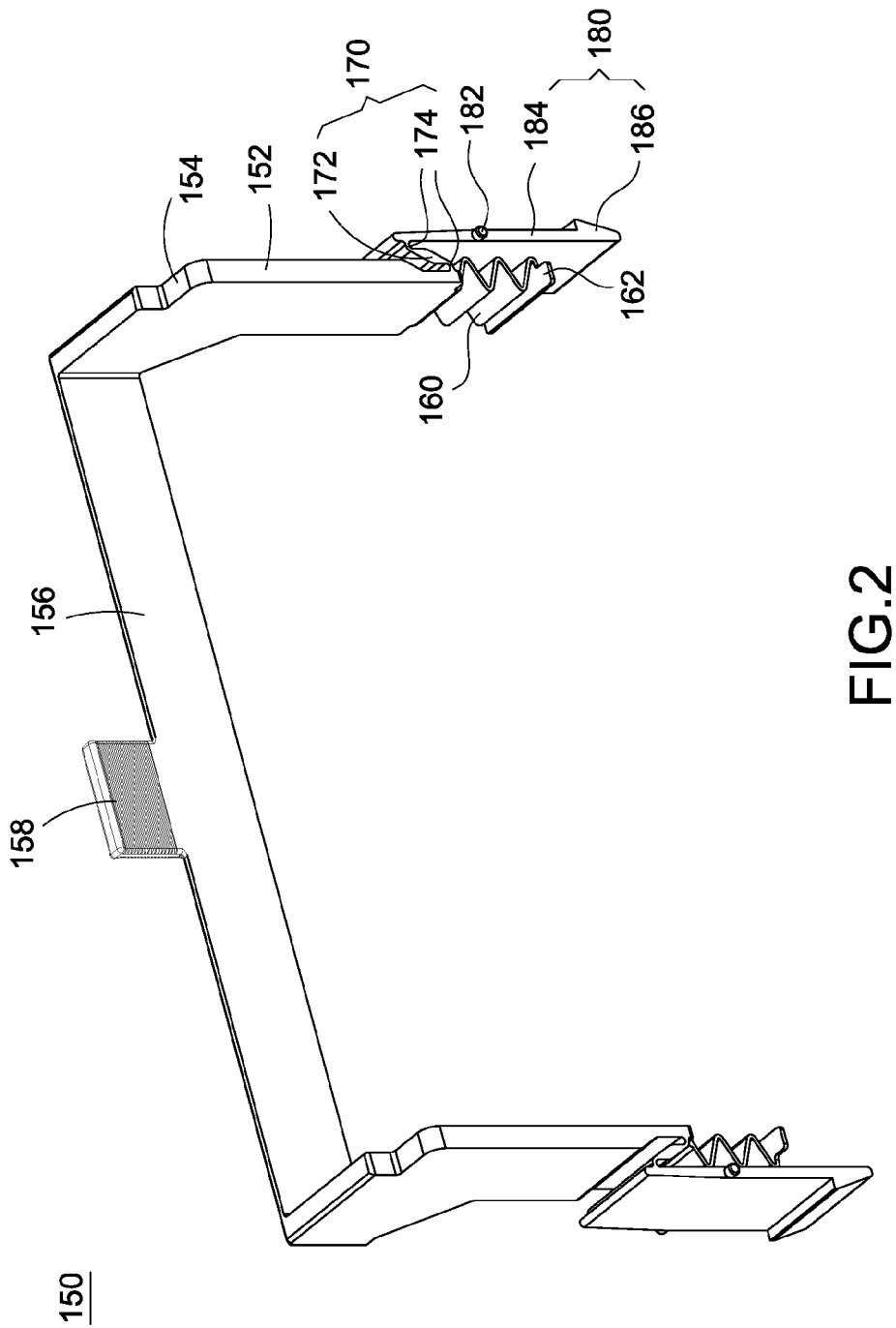
FIG. 2 is a perspective view illustrating a locking and release member according to the first embodiment of the present invention.
Figure 3:
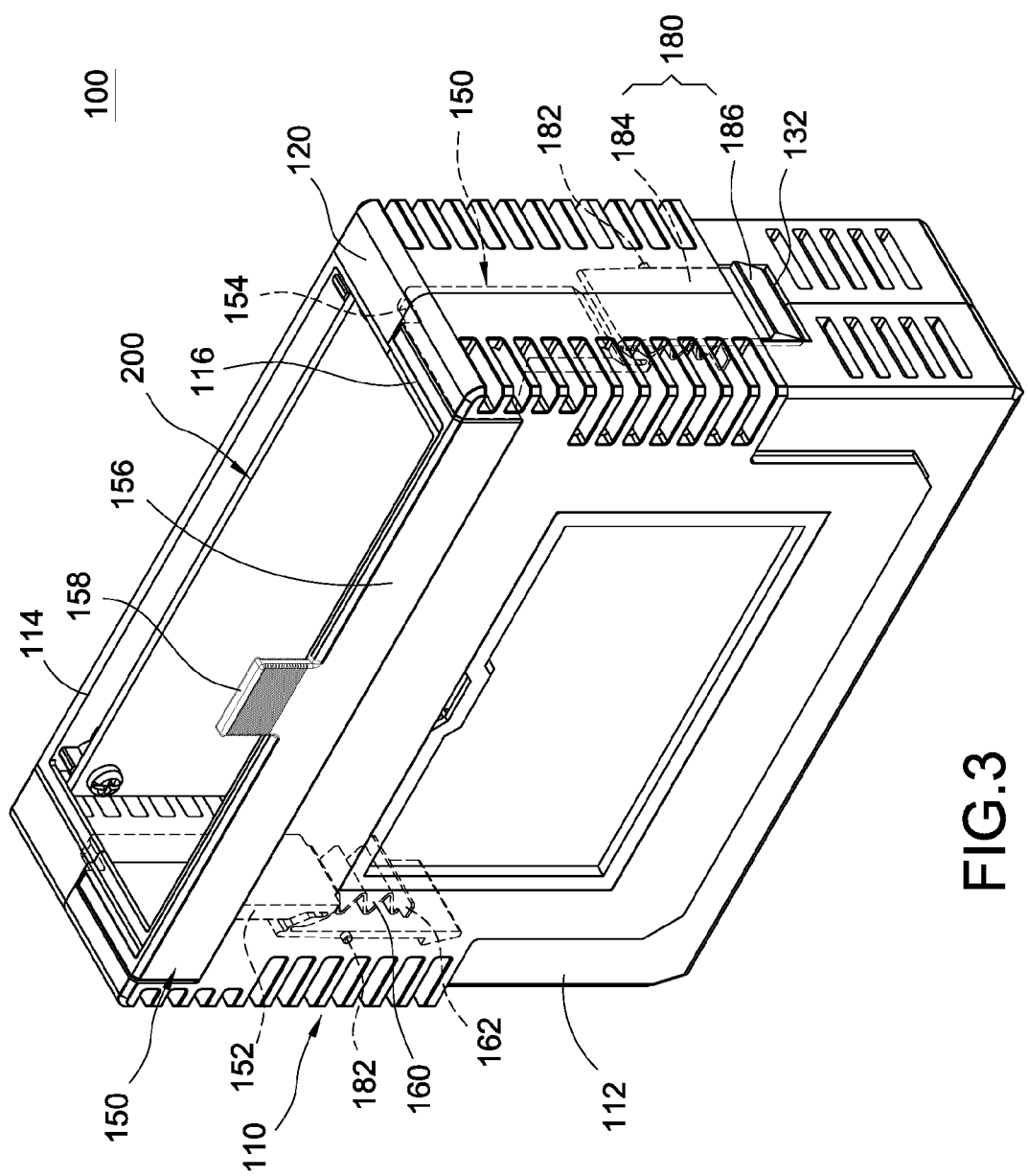
FIG. 3 is a perspective view according to the first embodiment of the present invention.

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Referring to FIGS. 1 to 4, the present invention provides a housing device 100 having a pull-type locking and release structure. The housing device 100 includes a housing 110 and a locking and release member 150. The housing device 100 preferably collaborates with a casing 10 to together constitute an electronic device (not illustrated). The electronic device includes, but not limited to, a router, a set-top box, a wireless module, a control module, a digital input/ output device, and even includes an industrial personal computer (IPC) or a programmable logic controller (PLC). However, in other embodiments, the housing device 100 is also applied to the housing 110 of a non-electronic device; the present invention is not limited in this regard.

The housing device 100 further includes a circuit board 200 and an electrical insertion end 210 protruding from one end of the circuit board 200. The housing 110 includes an opening 140, and the electrical insertion end 210 protrudes from the opening 140. When the housing device 100 is assembled to the casing 10, the electrical insertion end 210 is correspondingly inserted in an insertion slot 30 of the casing 10 for electrical connection.

In the present embodiment, the housing 110 includes two lateral walls 130, a breach 132 formed on each of the lateral walls 130, an elongated groove 134 along each of the lateral walls 130, and a pivot hole 136 formed on each of the lateral walls 130. Each of the pivot holes 136 communicates with a corresponding one of the elongated grooves 134. In the embodiment shown in FIG. 1, the housing 110 is preferably made of plastic and is preferably in a rectangular shape. The housing 110 includes a first housing part 112 and a second housing part 114 coupled to each other. The first housing part 112 includes a slot 116 communicating with the elongated groove 134 and includes a plurality of fastening points 118 disposed at the lateral wall 130. The second housing part 114 includes a cover plate 120 covering each of the elongated grooves 134 and includes a plurality of fastening plates 122 disposed corresponding to the fastening points 118 for engagement therewith. The first housing part 112 is coupled to the second housing part 114, and the cover plate 120 is disposed corresponding to the slot 116.

The locking and release member 150 is preferably made of plastic and includes two arms 152 disposed in the two elongated grooves 134, a rod 156 connected to the two arms 152, a resilient element 160 disposed at one end of each of the arms 152, a connection element 170 connected to each of the arms 152, a fastening element 180 connected to each of the connection elements 170, and a pivot 182 protruding from one side of each of the fastening elements 180. The pivot 182 is pivotally connected to the pivot hole 136, and the fastening element 180 is rotatable about the pivot 182. When the rod 156 drives the two arms 152 to move with respect to the elongated groove 134, the connection element 170 pushes one end of the fastening element 180 to move, and the other end of the fastening element 180 is away from the breach 132 to disengage and release the housing 110 from the two fastening holes 20 of the casing 10.

Figure 4:
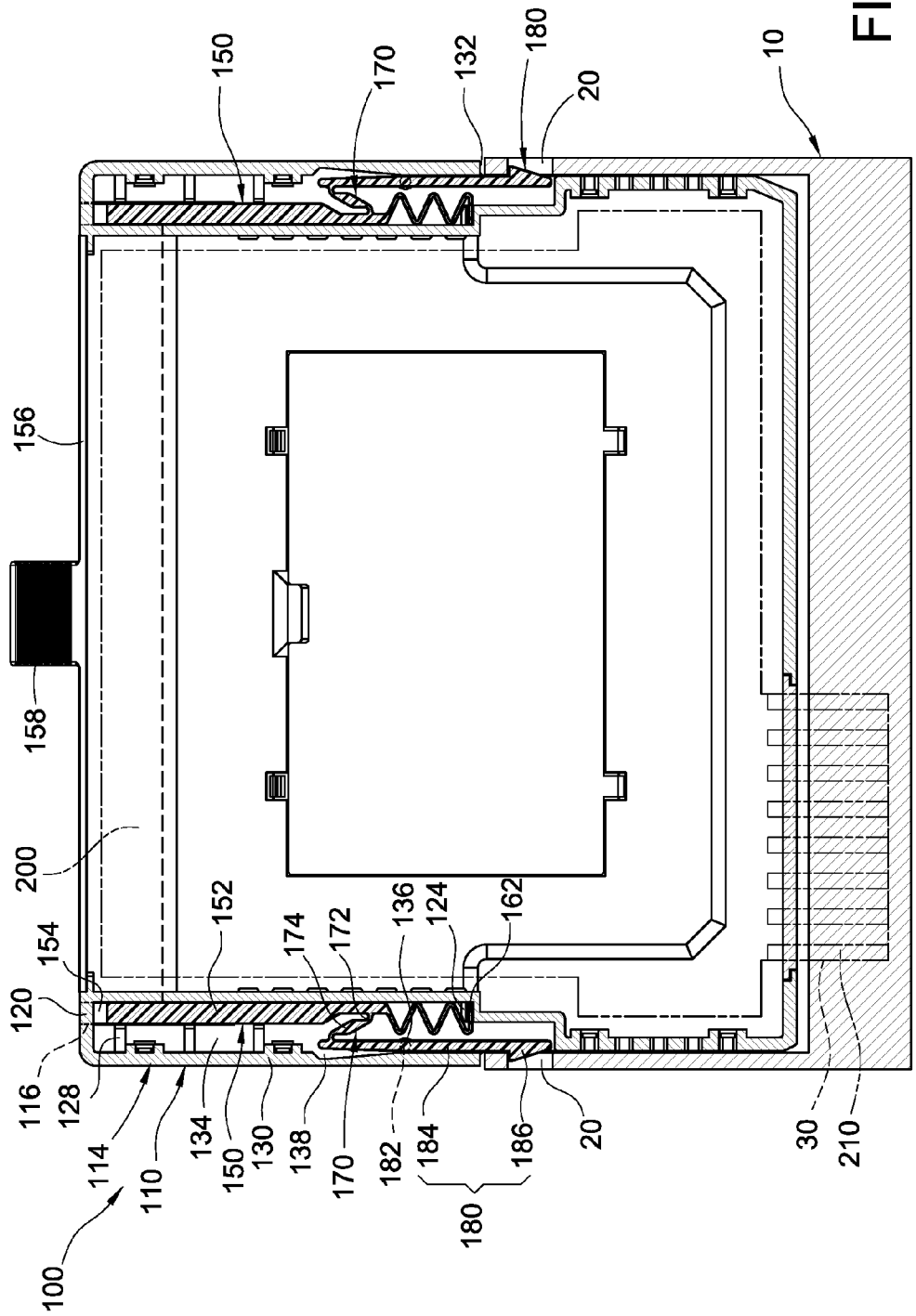
FIG. 4 is a cross-sectional view according to the first embodiment of the present invention.

Furthermore, as shown in FIG. 4, the casing 10 has two fastening holes 20 corresponding to the two breaches 132. When the housing device 100 is inserted and connected to the insertion slot 30 of the casing 10, the fastening elements 180 are quickly engaged with the two fastening holes 20 to complete assembling. One end of each of the arms 152 includes an indentation 154, and the housing 110 includes a cover plate 120 disposed corresponding to the indentation 154 and covering the elongated groove 134, so that the arm 152 is inserted through the slot 116, and the indentation 154 is blocked by the cover plate 120. Each of the fastening elements 180 includes a fastening plate 184 and a hook 186 at one end of the fastening plate 184, the pivot 182 protrudes from two sides of the fastening plate 184, and each of the hooks 186 is disposed corresponding to each of the breaches 132 for engagement with each of the fastening holes 20.

Figure 5:
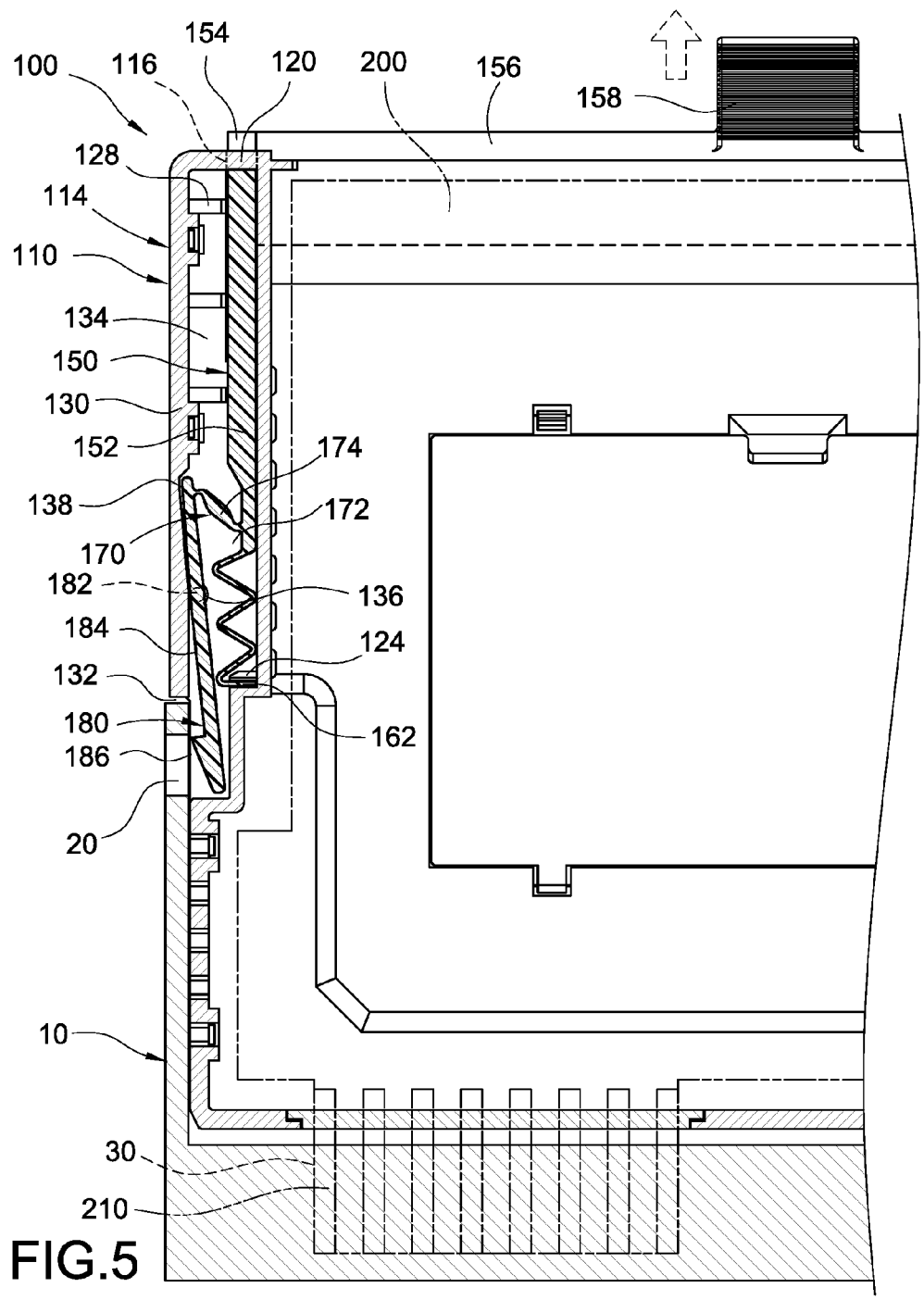
FIG. 5 is a cross-sectional view showing a first action according to the first embodiment of the present invention.
Figure 6:
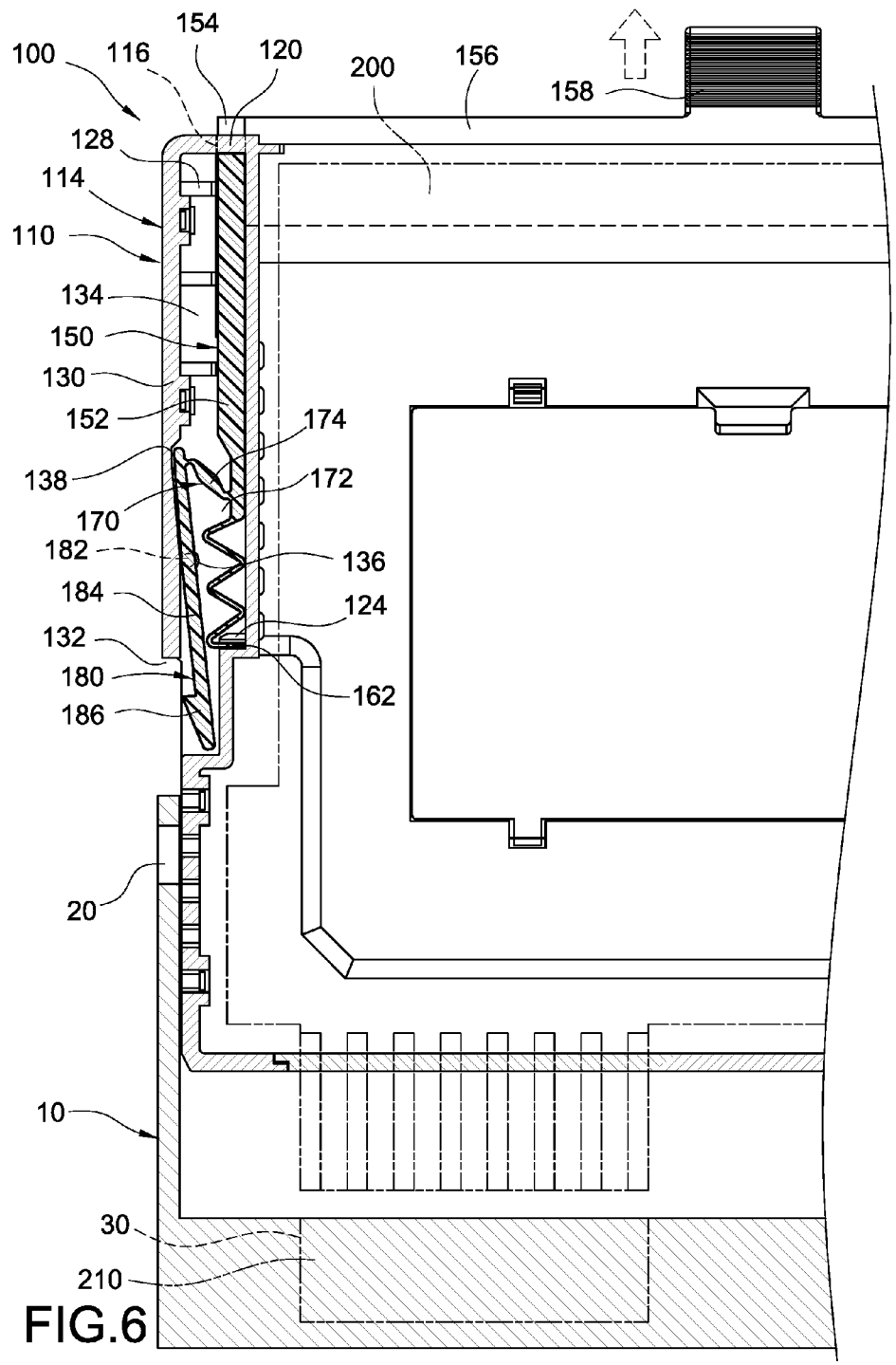
FIG. 6 is a cross-sectional view showing a second action according to the first embodiment of the present invention.

Referring to FIGS. 5 and 6, each of the arms 152 is disposed parallel to each of the fastening elements 180. The connection element 170 is connected to the arm 152 and the fastening element 180. The connection element 170 is preferably disposed between the arm 152 and the fastening element 180. Each of the connection elements 170 includes a body 172 and includes two connection ends 174 connected to the arm 152 and the fastening element 180 respectively, and a thickness of the connection end 174 is less than a thickness of the body 172. The connection element 170 made of plastic has a width which preferably corresponds to a width of the arm 152 and a width of the fastening element 180, so the connection element 170 has sufficient strength, and each of the connection ends 174 can be moved easily by movement of the arm 152 or the fastening element 180.

Each of the lateral walls 130 includes a recess 138 adjacent to the pivot hole 136, and the recess 138 receives one end of the fastening element 180. As shown in FIGS. 4 to 6, the pivot 182 preferably protrudes from the middle of the fastening plate 184, and thereby the fastening element 180 can rotate about the pivot 182, the recess 138 receives one end of the fastening plate 184, and as a result, the hook 186 can be released from the fastening hole 20.

According to the first embodiment, it is preferable that each resilient element 160 and the arm 152 are integrally formed and are made of plastic or suitable materials. The resilient element 160 is preferably a flat spring juxtaposed with the fastening element 180 in the elongated groove 134. In other words, each resilient element 160 is preferably connected to a lower end of each arm 152 in an integral form. However, in the second embodiment shown in FIG. 7, each resilient element 160 can be a tension spring assembled to the lower end of the arm 152. Furthermore, one end of each resilient element 160 includes a positioning end 162, the housing 110 or the arm 152 includes a joining member 124 corresponding to the positioning end 162, the positioning end 162 is engaged with the joining member 124, and thereby the two arms 152 can be elastically restored to their initial positions.

Figure 7:
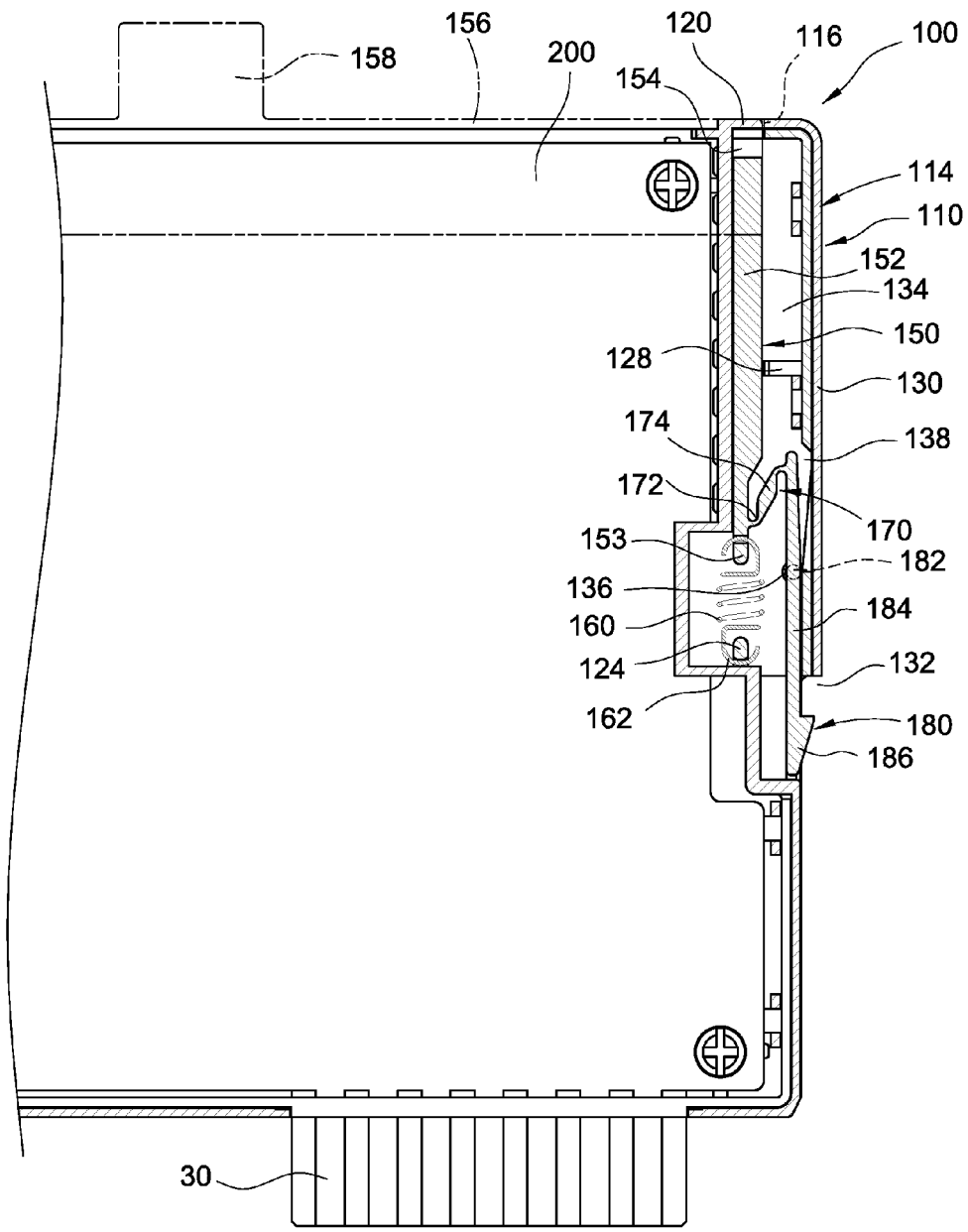
FIG. 7 is a partial cross-sectional view according to the second embodiment of the present invention.

In the first embodiment, the positioning end 124 of the flat spring is an insertion plate, and the joining member 124 of the housing 110 is a positioning block for insertion and fixation of the insertion plate. In the second embodiment, the positioning end 162 of the tension spring is preferably a clasp, and the joining member 124 of the housing 110 is a positioning hole for engagement with the clasp. In FIG. 7, two ends of the tension spring are clasps for engagement with the positioning hole of the housing 110 and a positioning hole of the arm 152 (i.e. a joining member 153).

When a user pulls up the rod 156 of the locking and release member 150, the arm 152 drives the corresponding resilient element 160 and the corresponding connection element 170 to move upward. By means of the lever principle, the fastening element 180 is pushed by the connection element 170 to move toward the recess 138, and the hook 186 is also away from the breach 132 to be disengaged and released from the fastening hole 20. At the same time, the electrical insertion end 210 of the housing device 100 is detached from the insertion slot 30 of the casing 10, thereby facilitating easy and rapid detachment.

It should be noted that, the pivot 182 of the fastening element 180 is fixed in the pivot hole 136, the positioning end 162 of the resilient element 160 is fastened to the joining member 124, and the cover plate 120 of the housing 110 restricts the indentation 154 of each arm 152. Therefore, when the locking and release member 150 is pulled up, the whole housing device 100 is also moved together.

When the user releases the rod 156 of the locking and release member 150, each resilient element 160 elastically restores each arm 152 to its initial position, at the same time each connection element 170 pulls each fastening element 180, and by means of the lever principle, the hook 186 returns to the breach 132. Since the hook 186 of each fastening element 180 has a chamfer (not labelled) at one side, the housing device 100 can be assembled to the casing 10 easily and rapidly after maintenance or repairing of the housing device 100.

Figure 8:
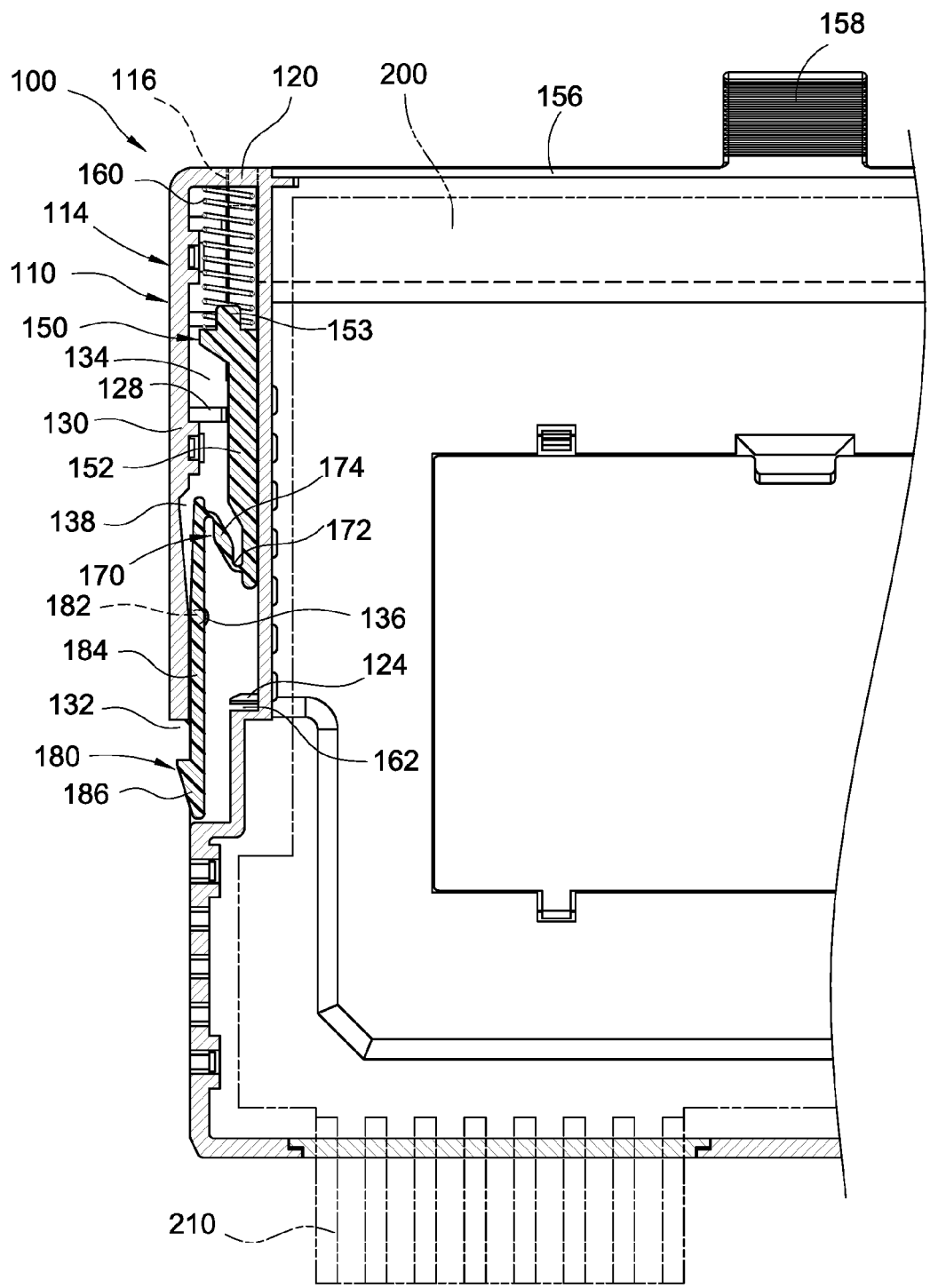
FIG. 8 is a partial cross-sectional view according to the third embodiment of the present invention.
Figure 9:
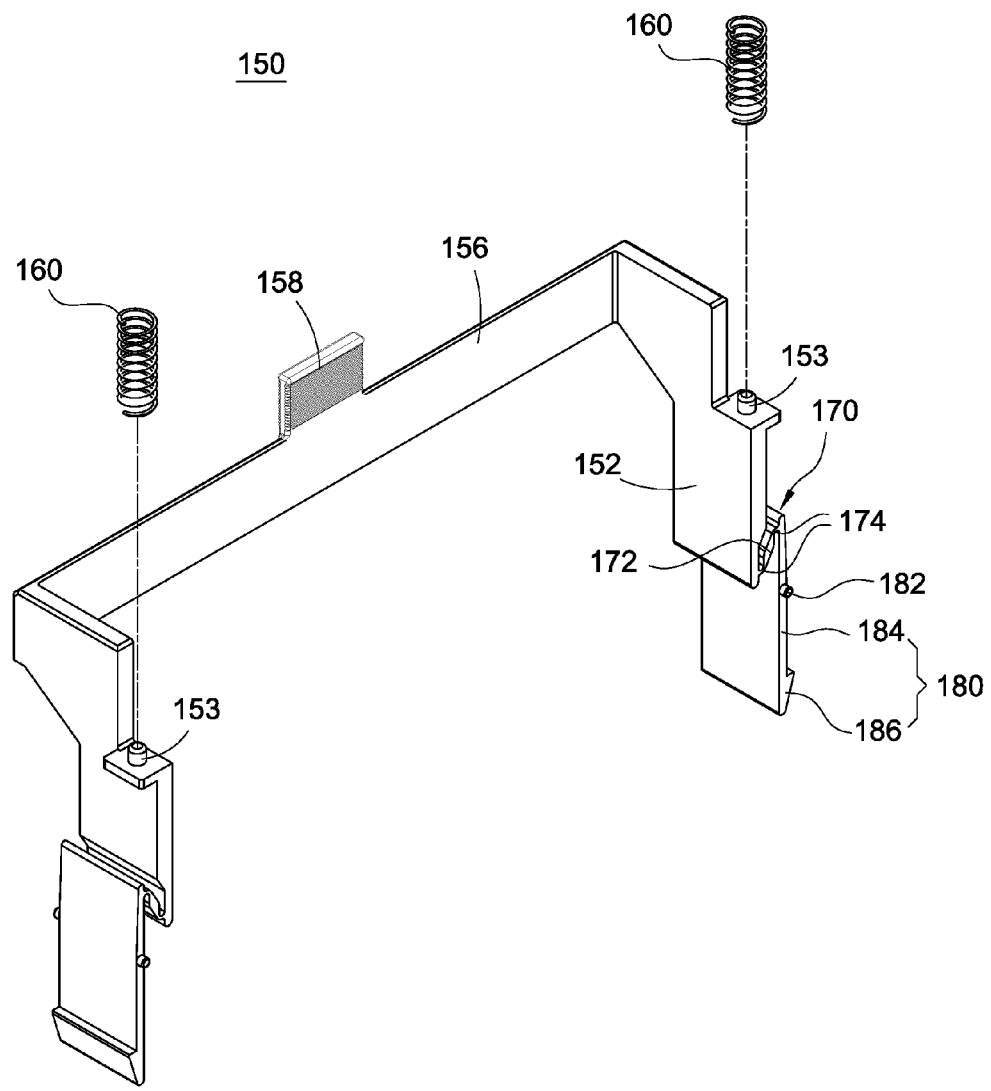
FIG. 9 is a perspective view according to the third embodiment of the present invention.

Please refer to FIGS. 8 and 9, showing a partial cross-sectional view and a perspective view of the locking and release member according to the third embodiment of the present invention. In the present embodiment, each resilient element 160 is preferably assembled to an upper end of each arm 152, and each arm 152 includes the joining member 153 like a positioning pillar. Each resilient element 160 is preferably a compression spring disposed away from the fastening element 180, one end of the compression spring receives the positioning pillar, and the other end of the compression spring is in contact with the cover plate 120 of the housing 110.

Figure 10:
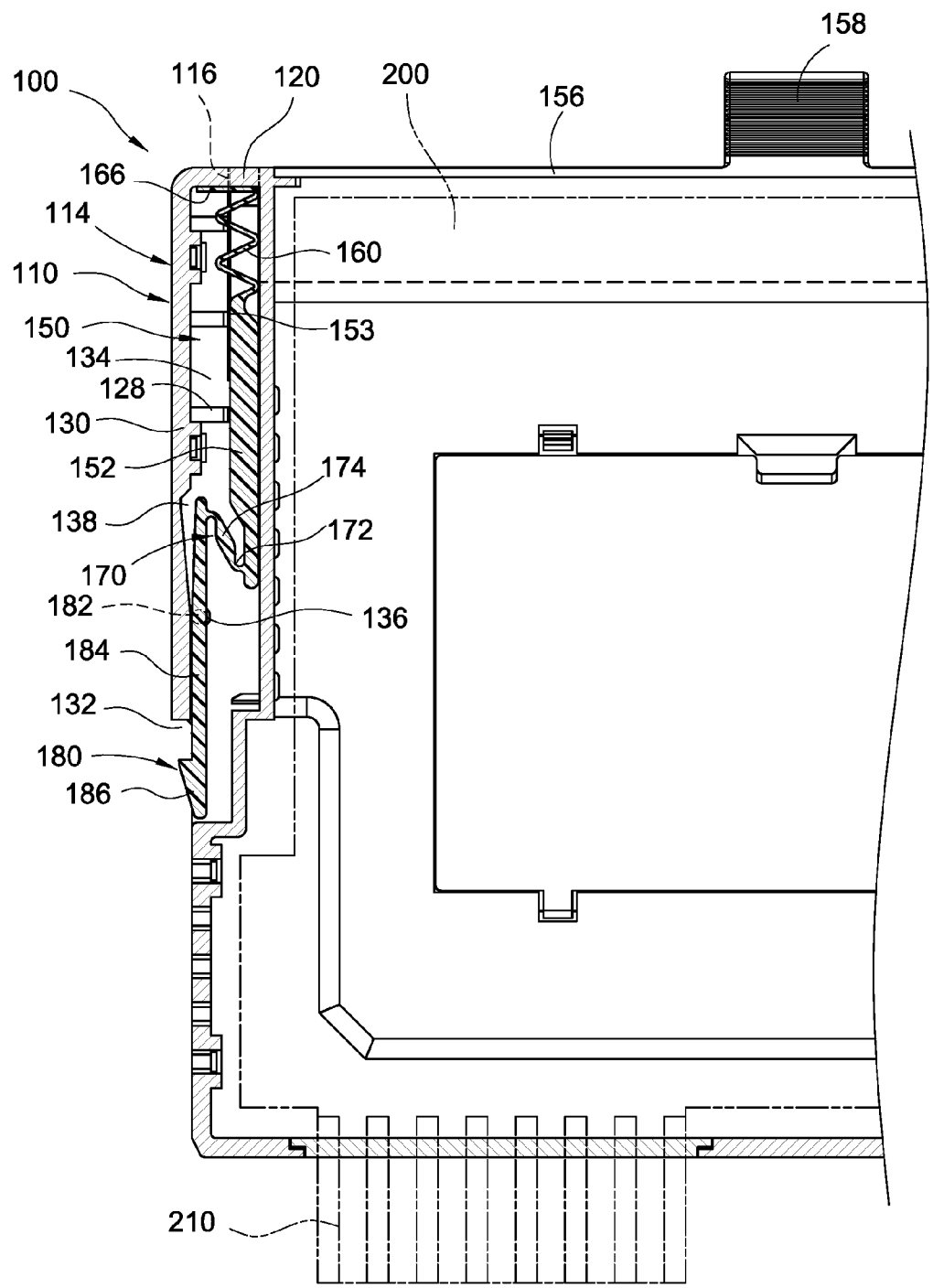
FIG. 10 is a partial cross-sectional view according to the fourth embodiment of the present invention.
Figure 11:
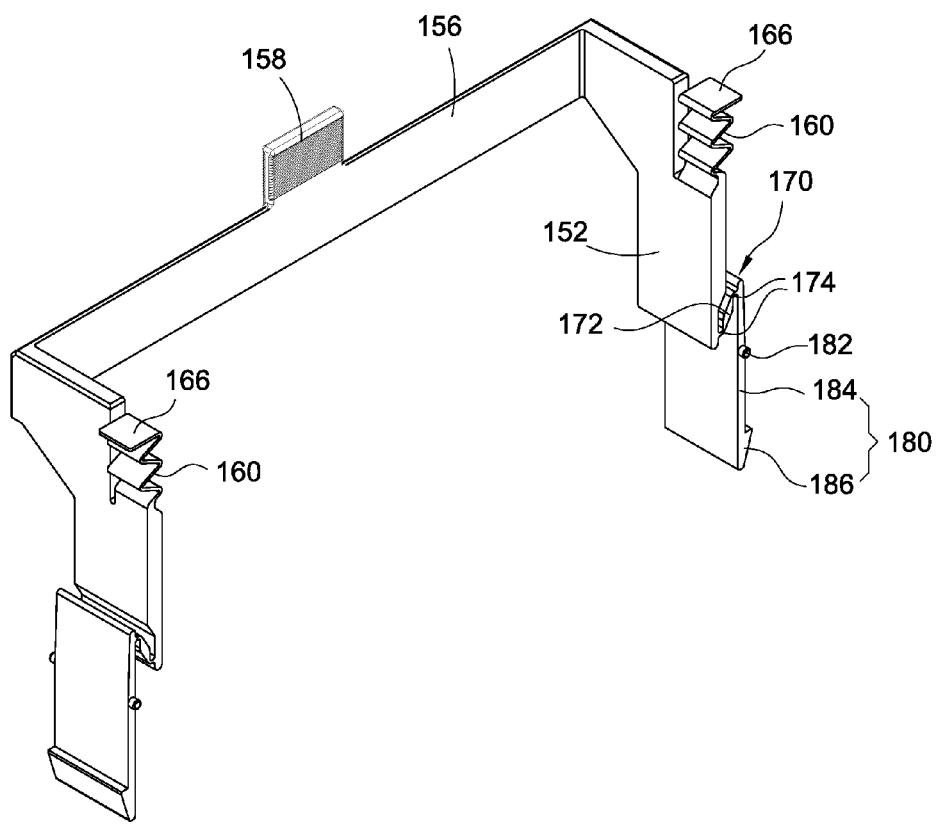
FIG. 11 is a perspective view illustrating the locking and release member according to the fourth embodiment of the present invention.

In the fourth embodiment shown in FIGS. 10 and 11, each resilient element 160 is preferably a flat spring integrally formed with each arm 152. The present embodiment is different from the first embodiment in that, the flat spring is disposed at the upper end of each arm 152, i.e. away from the fastening element 180. A free end of each resilient element 160 is preferably a contact end 166 in contact with the cover plate 120 for exerting a force to the housing 110 to move it.

Figure 12:
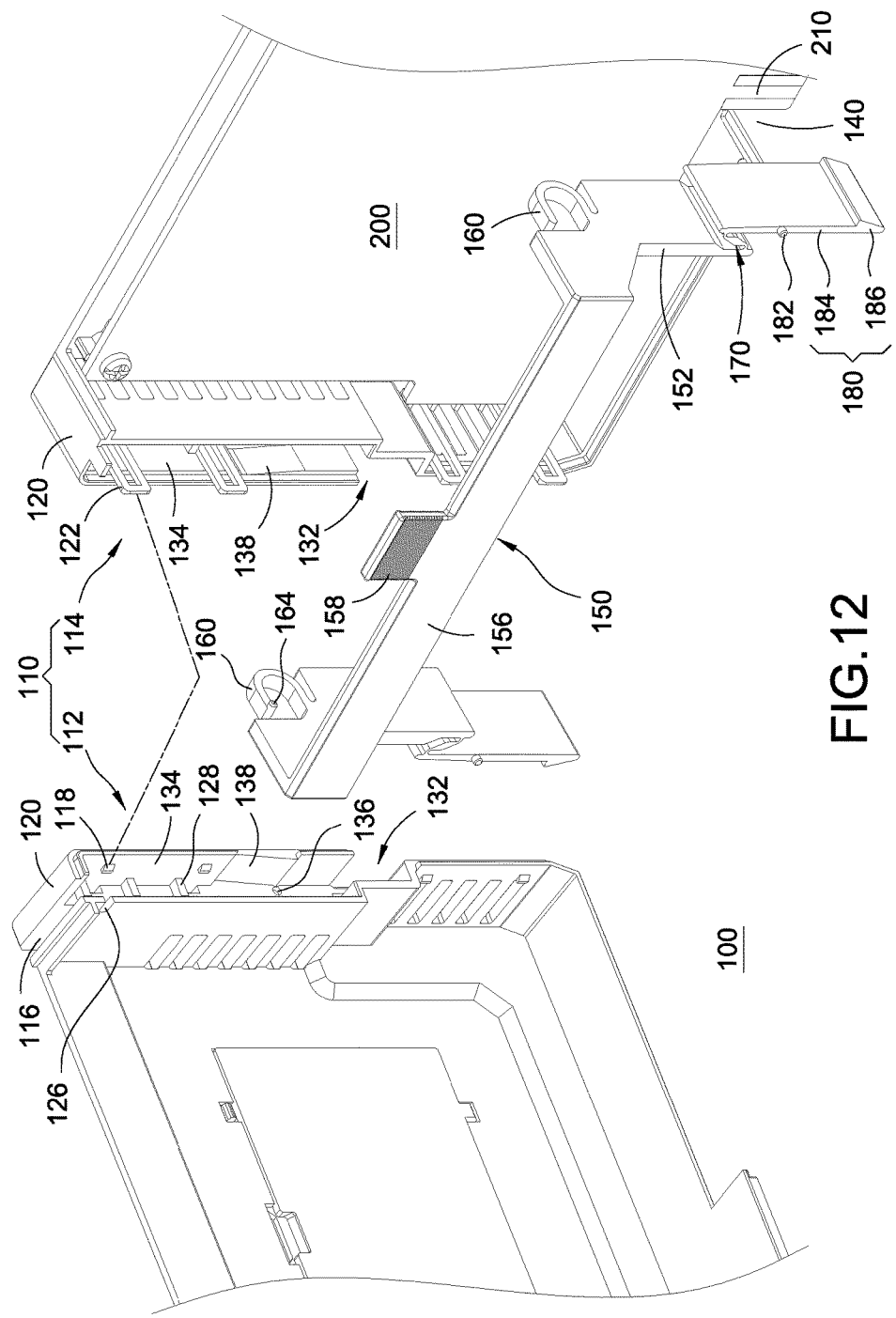
FIG. 12 is an exploded view according to the fifth embodiment of the present invention.
Figure 13:
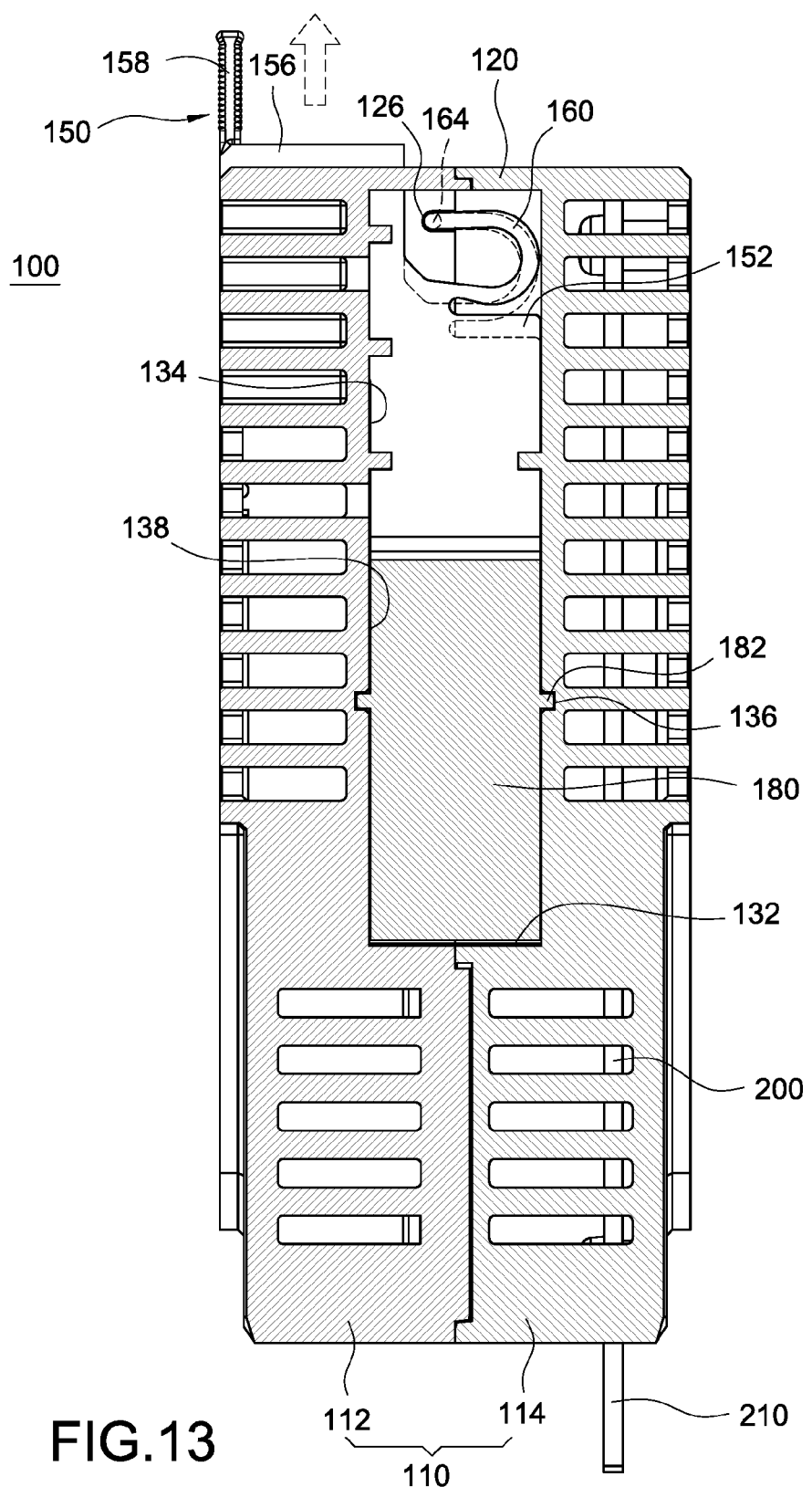
FIG. 13 is a cross-sectional view illustrating the locking and release member according to the fifth embodiment of the present invention.

Please refer to FIGS. 12 and 13, showing an exploded view and a cross-sectional view according to the fifth embodiment of the present invention. In this embodiment, each resilient element 160 is preferably integrally formed with each arm 152 and is disposed at the upper end of each arm 152. As shown in the drawing, each resilient element 160 is preferably a plate spring in a bent shape. A free end of each plate spring includes a protruding pillar 164 protruding toward the inside of the housing 110, the housing 110 includes a retaining groove 126 corresponding to the protruding pillar 164, so that the protruding pillar 164 is positioned in the retaining groove 126, which provides a force point for the locking and release member 150 to drive movement of the housing 110.

It should be noted that, each of the resilient elements 160 in the first and second embodiments is preferably disposed at the lower end of the arm 152. When each arm 152 is pulled and moved by the rod 156, each resilient element 160 stretches to store energy. In the third, fourth and fifth embodiments, each resilient element 160 is disposed at the upper end of the arm 152. When each arm 152 is pulled and moved by the rod 156, each resilient element 160 is compressed to store the energy. When the rod 156 is released, the stored energy of each resilient element 160 is released to exert an elastic force to restore each fastening element 180 to its initial position. The operations and driving mechanism are described above in the first embodiment.

In order for the user to move the whole housing device 100 by pulling the locking and release member 150 with ease, the locking and release member 150 further includes a handle 158 at one side of the rod 156. The handle 158 is, for example, a pulling plate, a ring or a strap; the present invention is not limited in this regard. Furthermore, in order for the locking and release member 150 to move more stably in the elongated groove 134, the housing 110 further includes a plurality of support blocks 128 disposed at each of the lateral walls 130, and each of the support blocks 128 restrict movement of the respective corresponding arm 152 with respect to the respective corresponding elongated groove 134.

By means of the lever principle, the pivots 182 of the two fastening elements 180 are fixed in the pivot holes 136 of the housing 110, two arms 152 are driven to move by one single rod 156, and each arm 152 pushes one end of the fastening element 180, so that the other end of the fastening element 180 is away from the breach 132 to be disengaged and released from the fastening hole 20 of the casing 10. Accordingly, the housing device 100 can be detached from or assembled to the casing 10 rapidly, thereby facilitating maintenance or other works for electronic components inside.

Furthermore, the present invention utilizes the installed or integrally-formed resilient element 160. Therefore, when a strain pulling the locking and release member 150 is released, the elasticity of the resilient element 160 automatically pushes the corresponding arm 152 and the connection element 170. The connection element 170 pushes the corresponding fastening element 180, so that the fastening elements 180 return to the respective breaches 132. Accordingly, the user can quickly engage the housing device 100 with the two fastening holes 20 of the casing 10, in a convenient and time-saving manner.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A housing device having a pull-type locking and release structure, comprising:
   a housing (110), the housing (110) including two lateral walls (130), a breach (132) formed on each of the lateral walls (130), an elongated groove (134) formed along each of the lateral walls (130), and a pivot hole (136) formed on each of the lateral walls (130), wherein each of the pivot holes (136) communicates with a corresponding one of the elongated grooves (134); and
   a locking and release member (150), the locking and release member (150) including two arms (152) disposed in the two elongated grooves (134), a rod (156) connected to the two arms (152), a resilient element (160) disposed at one end of each of the arms (152), a connection element (170) connected to each of the arms (152), a fastening element (180) connected to each of the connection elements (170), and a pivot (182) protruding from one side of each of the fastening elements (180), wherein the pivot (182) is pivotally connected to the pivot hole (136), and when the rod (156) drives the two arms (152) to move with respect to the elongated grooves (134), the connection element (170) pushes one end of the fastening element (180) to move, and another end of the fastening element (180) is away from the breach (132).

2. The housing device having the pull-type locking and release structure of claim 1, wherein each of the arms (152) is parallel to each of the fastening elements (180), and the connection element (170) is connected to the arm (152) and the fastening element (180).

3. The housing device having the pull-type locking and release structure of claim 2, wherein each of the connection elements (170) includes a body (172) and includes two connection ends (174) connected to the arm (152) and the fastening element (180) respectively, and a thickness of the connection end (174) is less than a thickness of the body (172).

4. The housing device having the pull-type locking and release structure of claim 1, wherein each of the lateral walls (130) includes a recess (138) adjacent to the pivot hole (136), and the recess (138) receives one end of the fastening element (180).

5. The housing device having the pull-type locking and release structure of claim 1, wherein one end of each of the arms (152) includes an indentation (154), and the housing (110) includes a cover plate (120) disposed corresponding to each of the indentations (154) and covering each of the elongated grooves (134).

6. The housing device having the pull-type locking and release structure of claim 1, wherein each of the fastening elements (180) includes a fastening plate (184) and a hook (186) at one end of the fastening plate (184), the pivot (182) protrudes from at least one side of the fastening plate (184), and each of the hooks (186) is disposed corresponding to each of the breaches (132).

7. The housing device having the pull-type locking and release structure of claim 1, wherein one end of each of the resilient elements (160) includes a positioning end (162), the housing (110) or each of the arms (152) includes a joining member (124) corresponding to the positioning end (162), and the positioning end (162) is engaged with the joining member (124).

8. The housing device having the pull-type locking and release structure of claim 7, wherein the positioning end (162) is an insertion plate or a clasp, and the joining member (124) is a positioning block, a positioning hole or a positioning pillar.

9. The housing device having the pull-type locking and release structure of claim 1, wherein each of the resilient elements (160) is integrally formed with each of the arms (152).

10. The housing device having the pull-type locking and release structure of claim 9, wherein each of the resilient elements (160) is a flat spring or a plate spring.

11. The housing device having the pull-type locking and release structure of claim 10, wherein a free end of the flat spring further includes a protruding pillar (164), and the housing (110) includes a retaining groove (126) corresponding to the protruding pillar (164).

12. The housing device having the pull-type locking and release structure of claim 1, wherein the resilient element (160) is a compression spring or a tension spring installed at one end of the arm (152).

13. The housing device having the pull-type locking and release structure of claim 12, wherein a free end of the resilient element (160) is a contact end (166) in contact with the housing (110).

14. The housing device having the pull-type locking and release structure of claim 1, wherein the locking and release member (150) further includes a handle (158) at one side of the rod (156).

15. The housing device having the pull-type locking and release structure of claim 1, wherein the housing (110) further includes a plurality of support blocks (128) disposed at each of the lateral walls (130), and each of the support blocks (128) restricts movement of the respective corresponding arm (152) with respect to the respective corresponding elongated groove (134).

16. The housing device having the pull-type locking and release structure of claim 1, further comprising a circuit board (200) and an electrical insertion end (210) protruding from one end of the circuit board (200), the housing (110) including an opening (140), the electrical insertion end (210) protruding from the opening (140).

17. The housing device having the pull-type locking and release structure of claim 1, wherein the housing (110) includes a first housing part (112) and a second housing part (114) coupled to each other.

18. The housing device having the pull-type locking and release structure of claim 17, wherein the first housing part (112) includes two slots (116) communicating with the two elongated grooves (134) respectively and includes a plurality of fastening points (118) disposed at the lateral wall (130), the second housing part (114) includes a cover plate (120) covering each of the elongated grooves (134) and includes a plurality of fastening plates (122) disposed corresponding to the fastening points (118), and the cover plate (120) is disposed corresponding to the slot (116).

\* \* \* \* \*